US010541221B2

(12) United States Patent
Seol et al.

(10) Patent No.: US 10,541,221 B2
(45) Date of Patent: Jan. 21, 2020

(54) FAN-OUT SEMICONDUCTOR PACKAGE

(71) Applicant: SAMSUNG ELECTRONICS CO., LTD., Suwon-si (KR)

(72) Inventors: Yong Jin Seol, Suwon-si (KR); Myung Sam Kang, Suwon-si (KR); Young Gwan Ko, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/010,754

(22) Filed: Jun. 18, 2018

(65) Prior Publication Data

US 2019/0164926 A1 May 30, 2019

(30) Foreign Application Priority Data

Nov. 29, 2017 (KR) .................. 10-2017-0161754

(51) Int. Cl.
H01L 23/52 (2006.01)
H01L 23/00 (2006.01)
(Continued)

(52) U.S. Cl.
CPC ........ *H01L 24/25* (2013.01); *H01L 23/49822* (2013.01); *H01L 24/24* (2013.01);
(Continued)

(58) Field of Classification Search
CPC ........... H01L 23/3128; H01L 23/49822; H01L 23/13; H01L 23/3121; H01L 24/24; H01L 24/25
(Continued)

(56) References Cited

U.S. PATENT DOCUMENTS 7,525,814 B2 * 4/2009 Yuri .................... H01L 21/4857
361/306.3
9,307,632 B2 * 4/2016 Lee ...................... H05K 1/0271
(Continued)

FOREIGN PATENT DOCUMENTS

KR 10-2009-0120855 A 11/2009
KR 10-2010-0004332 A 1/2010
(Continued)

OTHER PUBLICATIONS

Notice of Office Action issued in Korean Application No. 10-2017-0161754, dated Sep. 17, 2018 (English translation).
(Continued)

*Primary Examiner* — Luan C Thai
(74) *Attorney, Agent, or Firm* — Sughrue Mion, PLLC

(57) ABSTRACT

A fan-out semiconductor package includes a core member having a through-hole in which a semiconductor chip is disposed. The semiconductor chip has an active surface having connection pads disposed thereon and an inactive surface opposing the active surface. An encapsulant encapsulates at least a portion of the semiconductor chip. A connection member is disposed on the active surface of the semiconductor chip and includes a redistribution layer electrically connected to the connection pads of the semiconductor chip. A passivation layer is disposed on the connection member. The fan-out semiconductor package further has a slot spaced part from the through-hole and penetrating through at least a portion of the core member or the passivation layer.

20 Claims, 13 Drawing Sheets

(51) Int. Cl.
*H01L 23/498* (2006.01)
*H01L 23/13* (2006.01)
*H01L 23/31* (2006.01)

(52) U.S. Cl.
CPC .......... *H01L 23/13* (2013.01); *H01L 23/3128* (2013.01); *H01L 2224/24155* (2013.01); *H01L 2224/25171* (2013.01)

(58) Field of Classification Search
USPC ........................................................ 257/773
See application file for complete search history.

(56) References Cited

U.S. PATENT DOCUMENTS

| | | | |
|---|---|---|---|
| 9,679,863 B2 * | 6/2017 | Lin | .......................... H01L 24/19 |
| 9,786,623 B2 * | 10/2017 | Lin | ....................... H01L 21/561 |
| 2005/0199998 A1 | 9/2005 | Chen et al. | |
| 2015/0287681 A1 | 10/2015 | Soh et al. | |
| 2017/0103951 A1 | 4/2017 | Lee et al. | |
| 2017/0178992 A1 | 6/2017 | Jeong et al. | |

FOREIGN PATENT DOCUMENTS

| | | |
|---|---|---|
| KR | 10-2013-0110871 A | 10/2013 |
| KR | 10-2014-0030903 A | 3/2014 |
| KR | 10-2017-0029920 A | 3/2017 |
| KR | 10-2017-0043440 A | 4/2017 |
| KR | 10-2017-0074080 A | 6/2017 |

OTHER PUBLICATIONS

Office Action issued in corresponding Korean Application No. 10-2017-0161754, dated Mar. 20, 2019.

Notice of Allowance dated Sep. 27, 2019 by the Korean Intellectual Property Office in counterpart Korean Patent Application No. 10-2017-0161754.

* cited by examiner

FAN-OUT SEMICONDUCTOR PACKAGE

CROSS-REFERENCE TO RELATED APPLICATION(S)

This application claims benefit of priority to Korean Patent Application No. 10-2017-0161754 filed on Nov. 29, 2017 in the Korean Intellectual Property Office, the disclosure of which is incorporated herein by reference in its entirety.

BACKGROUND

1. Field

The present disclosure relates to a fan-out semiconductor package.

2. Description of Related Art

Semiconductor packages are consistently being thinned and lightened through variations in their shapes, and are increasingly being relied upon to provide complex functionalities including system in package (SiP) functionalities.

One type of package technology suggested to satisfy the technical demands described above is a fan-out semiconductor package. Such a fan-out semiconductor package has a compact size and may allow a plurality of pins to be implemented by redistributing connection terminals outwardly of a region in which a semiconductor chip is disposed.

Meanwhile, in the case of such a fan-out semiconductor package, materials forming the semiconductor chip, the redistribution layer, and the like are different from each other. As a result, a defect such as warpage due to a difference in a coefficient of thermal expansion (CTE) may occur.

SUMMARY

An aspect of the present disclosure may provide a fan-out semiconductor package that exhibits reduced warpage by having a slot.

According to an aspect of the present disclosure, a slot filled with a different material may be formed in at least one of a core member or a passivation layer of the fan-out semiconductor package.

According to an aspect of the present disclosure, a fan-out semiconductor package may include a core member having a through-hole in which a semiconductor chip is disposed. The semiconductor chip has an active surface having connection pads disposed thereon and an inactive surface opposing the active surface. An encapsulant encapsulates at least a portion of the semiconductor chip, and a connection member is disposed on the active surface of the semiconductor chip and includes a redistribution layer electrically connected to the connection pads of the semiconductor chip. A passivation layer is disposed on the connection member. The fan-out semiconductor package further has a slot spaced apart from the through-hole and penetrating through at least a portion of the core member or the passivation layer.

BRIEF DESCRIPTION OF DRAWINGS

The above and other aspects, features, and other advantages of the present disclosure will be more clearly understood from the following detailed description taken in conjunction with the accompanying drawings, in which.

DETAILED DESCRIPTION

Hereinafter, exemplary embodiments will be described with reference to the accompanying drawings. In the accompanying drawings, shapes, sizes, and the like, of components may be exaggerated or stylized for clarity.

Electronic Device

Figure 1:
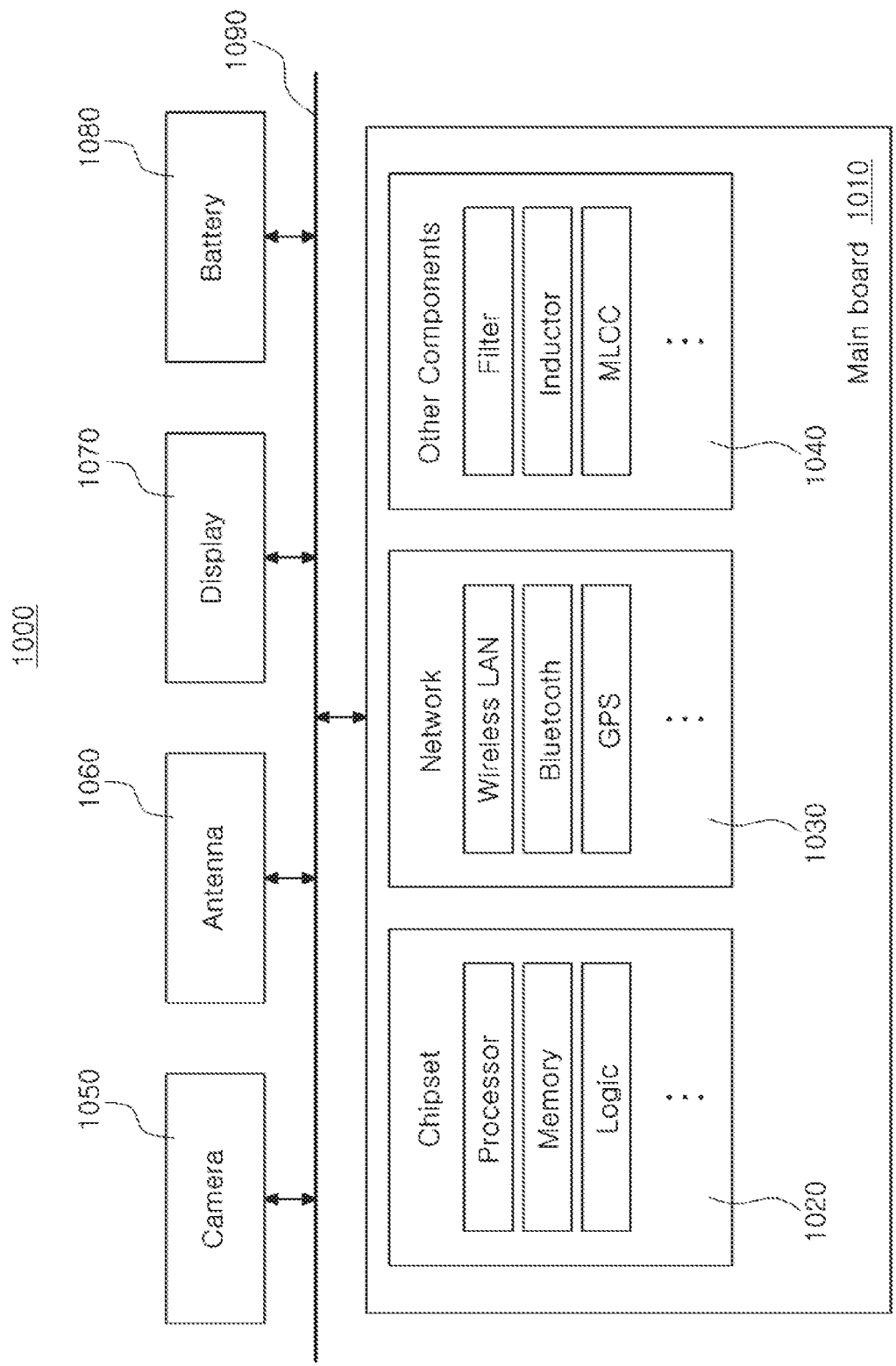
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below across various signal lines 1090.

The chip related components 1020 or chipset may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, and may also include other types of chip related components. In addition, the chip related components 1020 may be combined with each other.

The network related components 1030 may include components supporting communications using various protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the above-mentioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components used for various other purposes, and the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive component, or the like. However, the electronic device 1000 is not limited thereto, and may be any other electronic device processing data.

Figure 2:
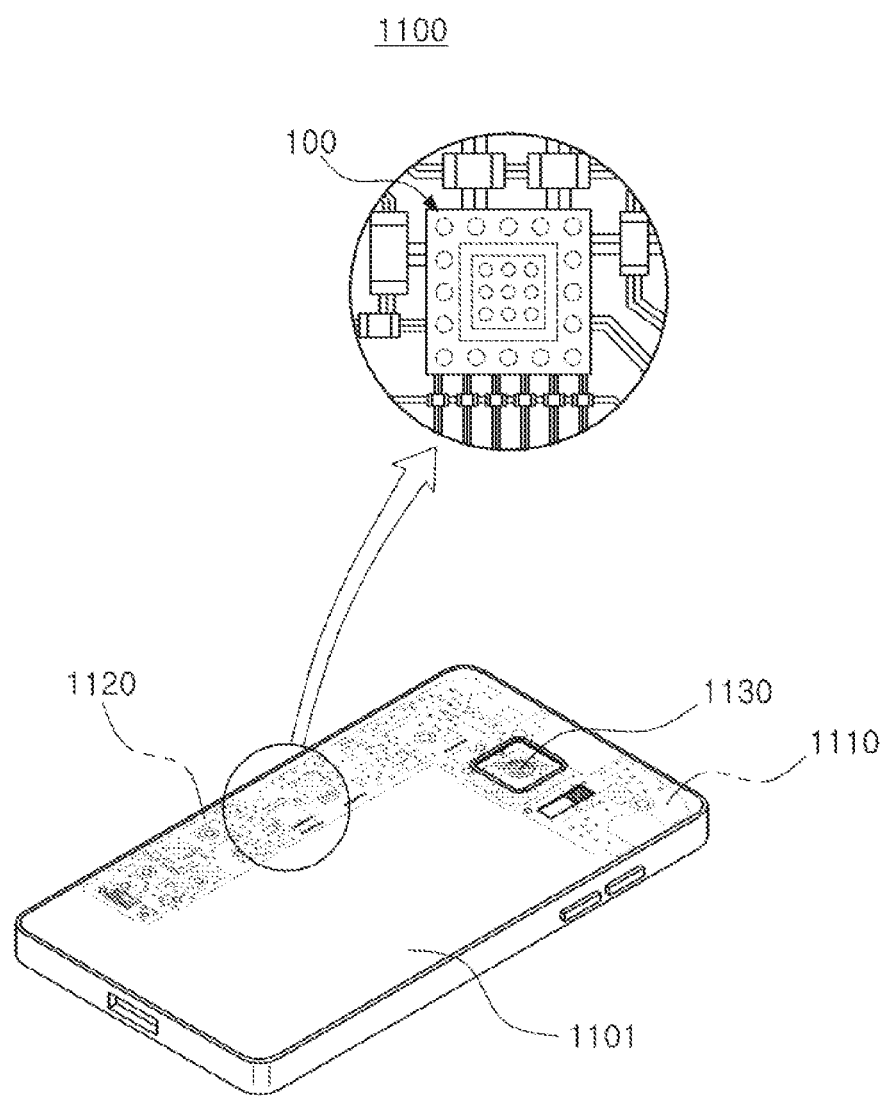
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various components 1120 may be physically or electrically connected to the motherboard 1110. In addition, other components that may or may not be physically or electrically connected to the mainboard 1010, such as a camera 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, and may be other electronic devices as described above.

Semiconductor Package

Generally, numerous fine electrical circuits are integrated in a semiconductor chip. However, the semiconductor chip may not serve as a semiconductor finished product in itself, and may be damaged due to external physical or chemical impact. Therefore, the semiconductor chip is not generally used by itself, but is instead packaged and used in an electronic device, or the like, in a packaged state.

A reason why semiconductor packaging generally is used is that there is a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor and the mainboard may advantageously be provided by the packaging.

A semiconductor package manufactured by packaging technology may be classified as a fan-in semiconductor package or a fan-out semiconductor package depending on a structure and a purpose thereof.

The fan-in semiconductor packages and the fan-out semiconductor packages will be described hereinafter in more detail with reference to the drawings.

Fan-in Semiconductor Package

Figure 3B:
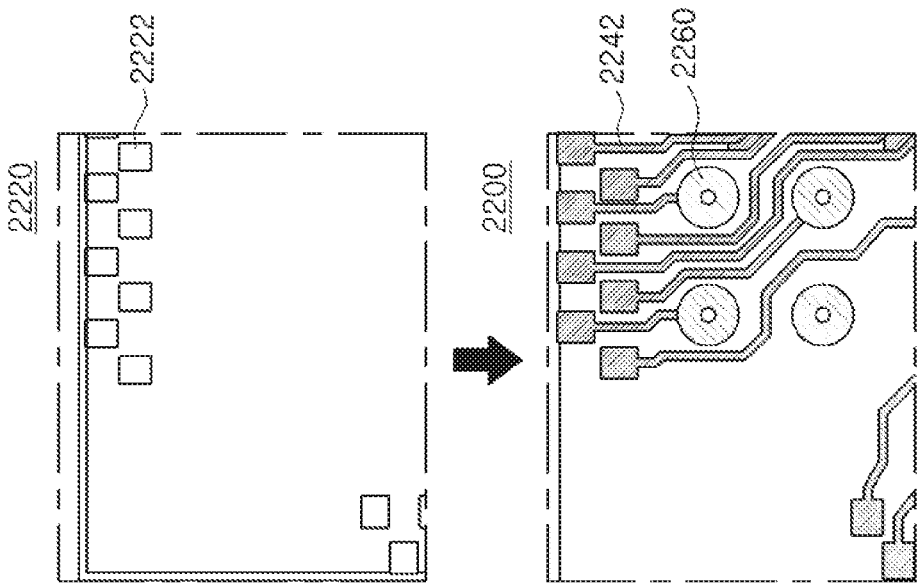
FIGS. 3A and 3B are schematic cross-sectional views illustrating a fan-in semiconductor package before and after being packaged.
Figure 3A:
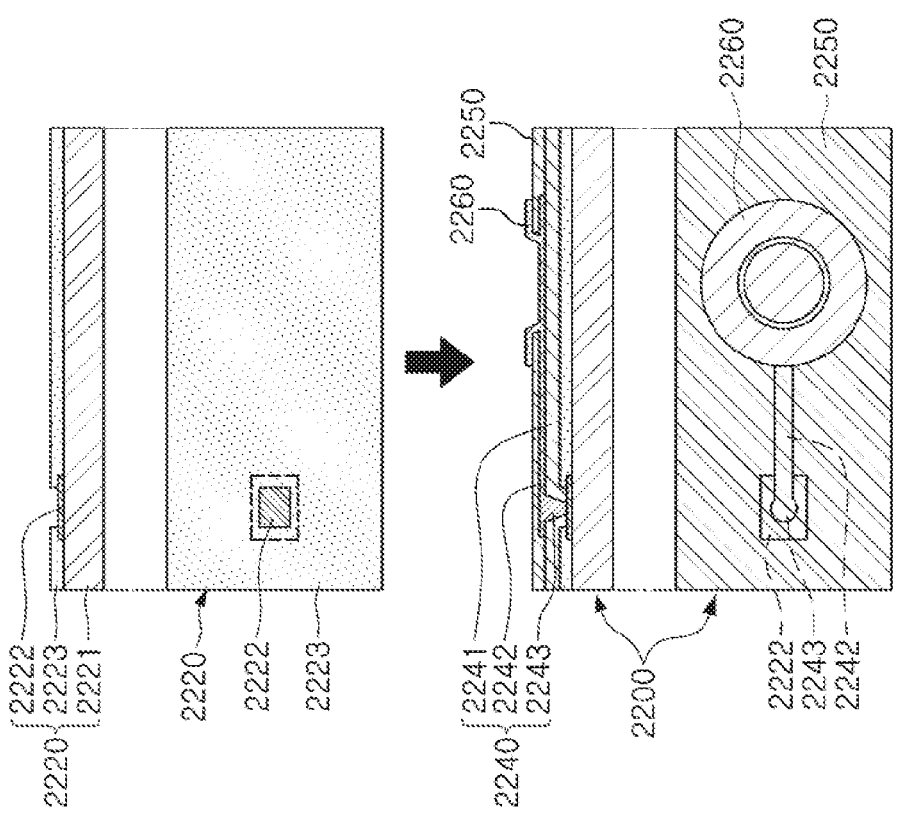

FIGS. 3A and 3B are schematic cross-sectional views illustrating a fan-in semiconductor package before and after being packaged.

Figure 4:
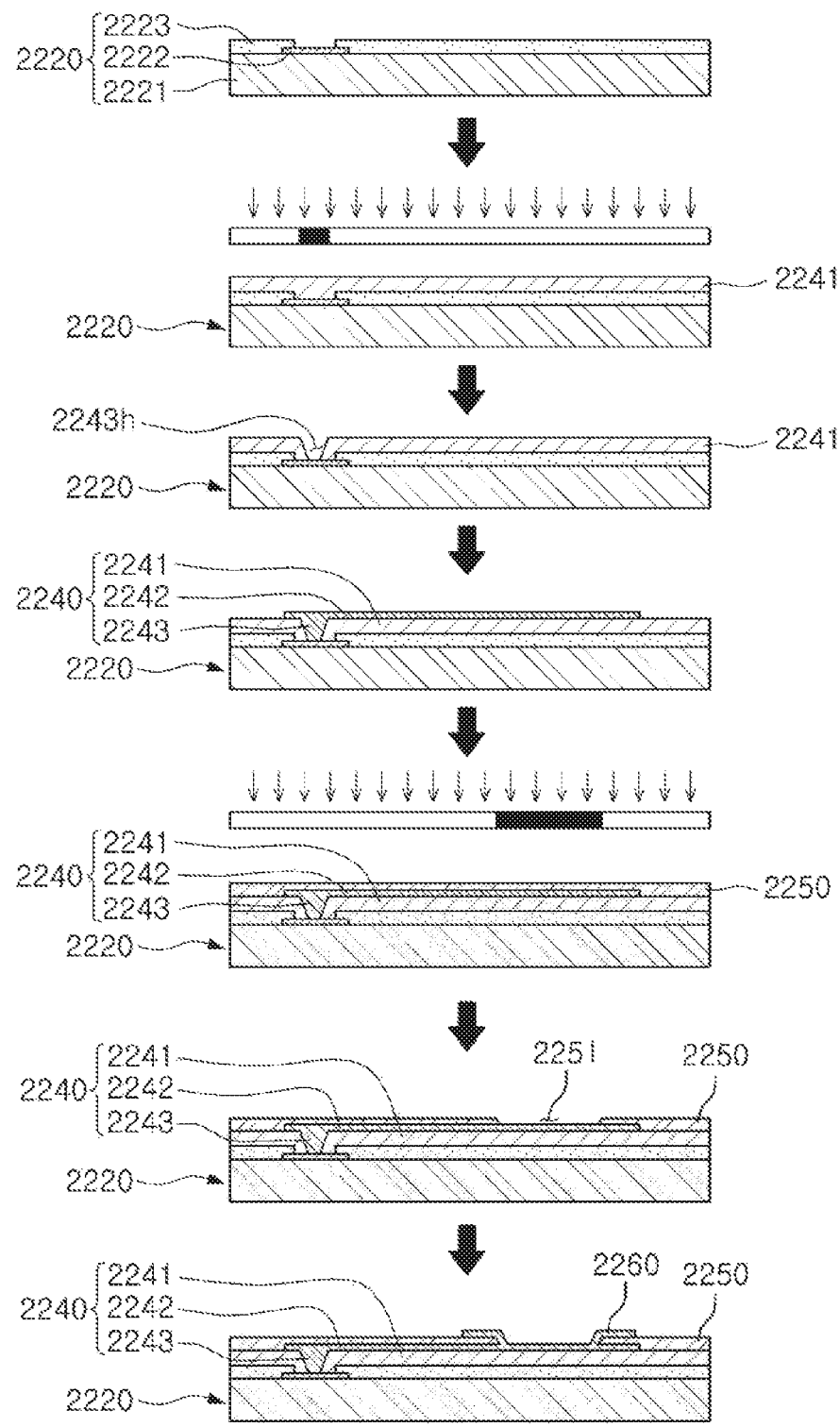
FIG. 4 is a schematic cross-sectional view illustrating a packaging process of a fan-in semiconductor package.

FIG. 4 is a schematic cross-sectional view illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the mainboard of the electronic device, or the like.

Therefore, a connection member 2240 may be formed (depending on a size of the semiconductor chip 2220) on the semiconductor chip 2220 in order to redistribute the connection pads 2222. The connection member 2240 may be formed by forming an insulating layer 2241 on the semiconductor chip 2220 using an insulating material such as a photo imageable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside a footprint or area of the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the footprint or area of the semiconductor chip in the fan-in semiconductor package, the fan-in semiconductor package has significant spatial limitations. Therefore, it is difficult to apply this structure to a semiconductor chip having a large number of I/O terminals or a semiconductor chip having a small size. In addition, due to the disadvantage described above, the fan-in semiconductor package may not always be directly mounted and used on the mainboard of the electronic device. The reason is that even in the case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
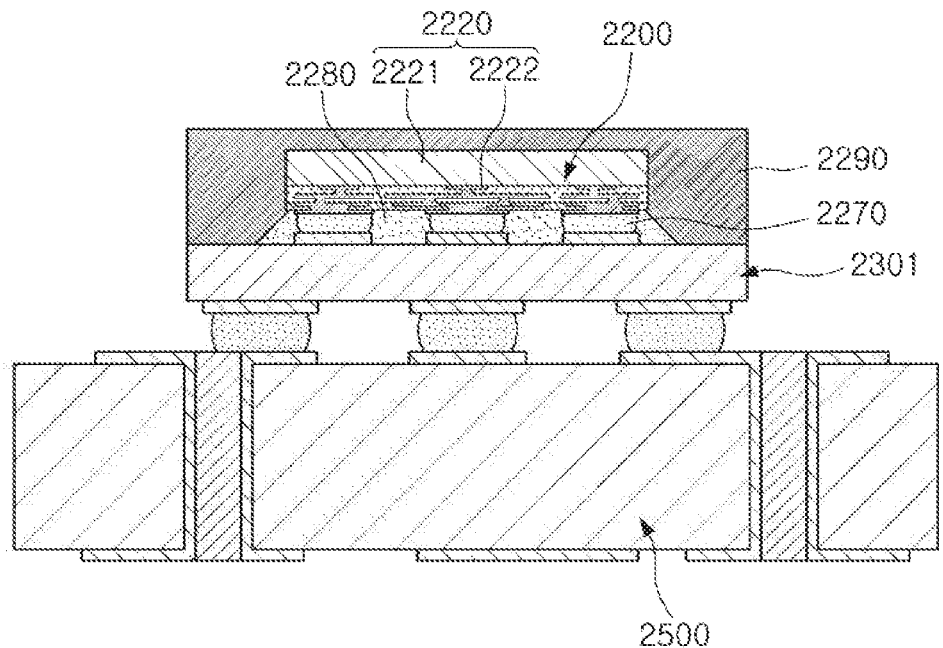
FIG. 5 is a schematic cross-sectional view illustrating a fan-in semiconductor package mounted on an interposer substrate and ultimately mounted on a mainboard of an electronic device.

FIG. 5 is a schematic cross-sectional view illustrating a fan-in semiconductor package mounted on an interposer substrate and ultimately mounted on a mainboard of an electronic device.

Figure 6:
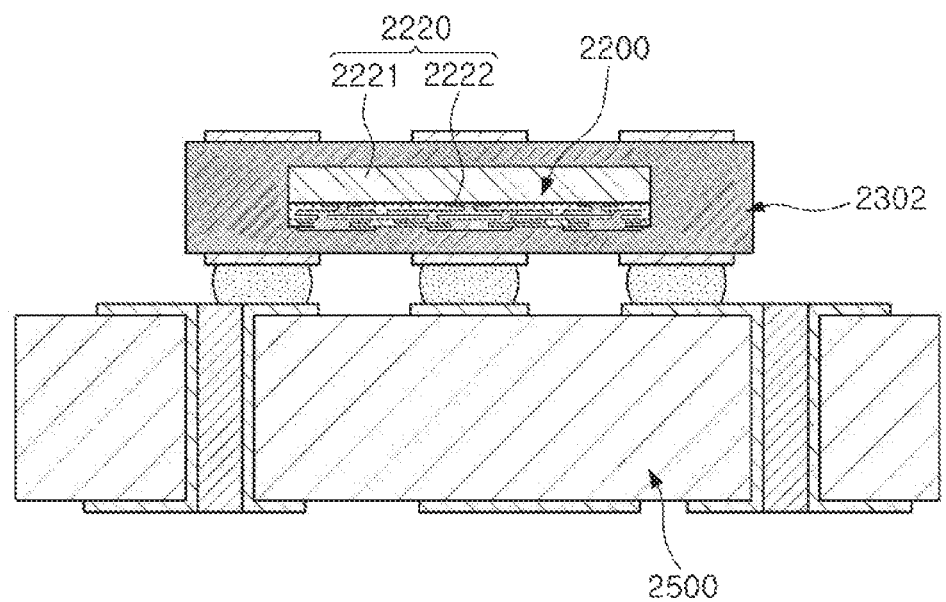
FIG. 6 is a schematic cross-sectional view illustrating a fan-in semiconductor package embedded in an interposer substrate and ultimately mounted on a mainboard of an electronic device.

FIG. 6 is a schematic cross-sectional view illustrating a fan-in semiconductor package embedded in an interposer substrate and ultimately mounted on a mainboard of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a mainboard 2500 of an electronic device while being mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in which the fan-in semiconductor package 2200 is embedded, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
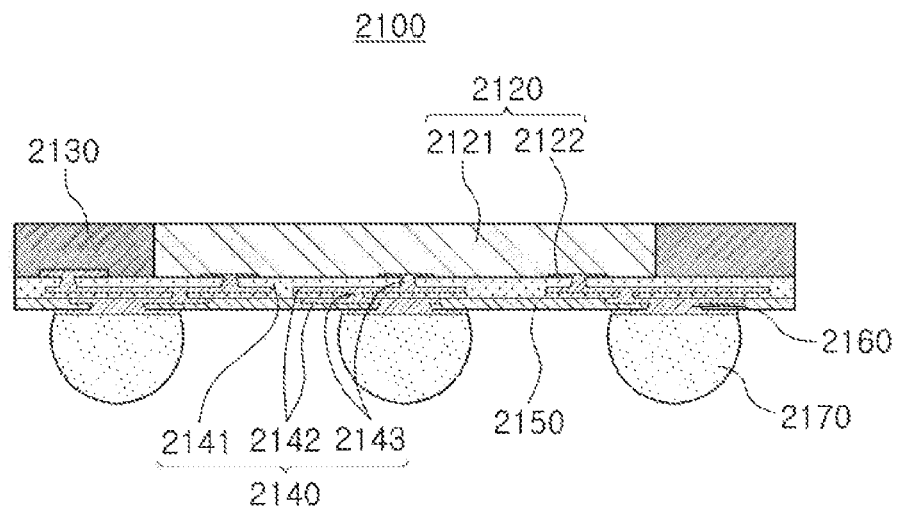
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side or periphery of a semiconductor chip 2120 may be protected by an encapsulant 2130, and connection pads 2122 of the semiconductor chip 2120 may be redistributed outwardly of the semiconductor chip 2120 by a connection member 2140. In this case, the connection member 2140 may extend under both the semiconductor chip 2120 and the encapsulant 2130. A passivation layer 2150 may further be formed on the connection member 2144, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on or in the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the footprint or area of the semiconductor chip through the connection member formed on the semiconductor chip. As described above, in the fan-in semiconductor package, all I/O terminals of the semiconductor chip need to be disposed inside the footprint of the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in the case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
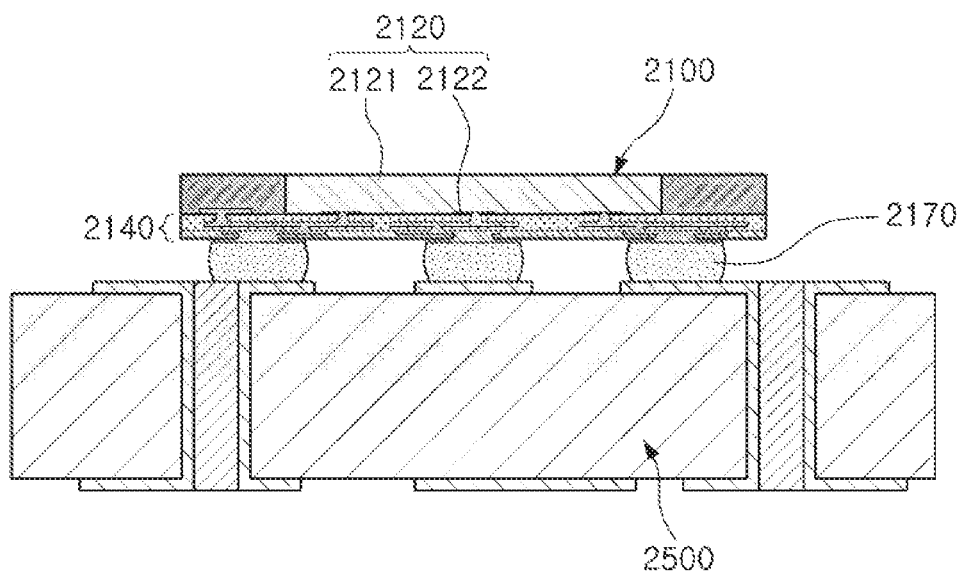
FIG. 8 is a schematic cross-sectional view illustrating a fan-out semiconductor package mounted on a mainboard of an electronic device.

FIG. 8 is a schematic cross-sectional view illustrating a fan-out semiconductor package mounted on a mainboard of an electronic device Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is conceptually different from that of a printed circuit board (PCB) such as an interposer substrate, or the like, having a scale, a purpose, and the like, different from those of the fan-out semiconductor package, and having the fan-in semiconductor package embedded therein.

Figure 9:
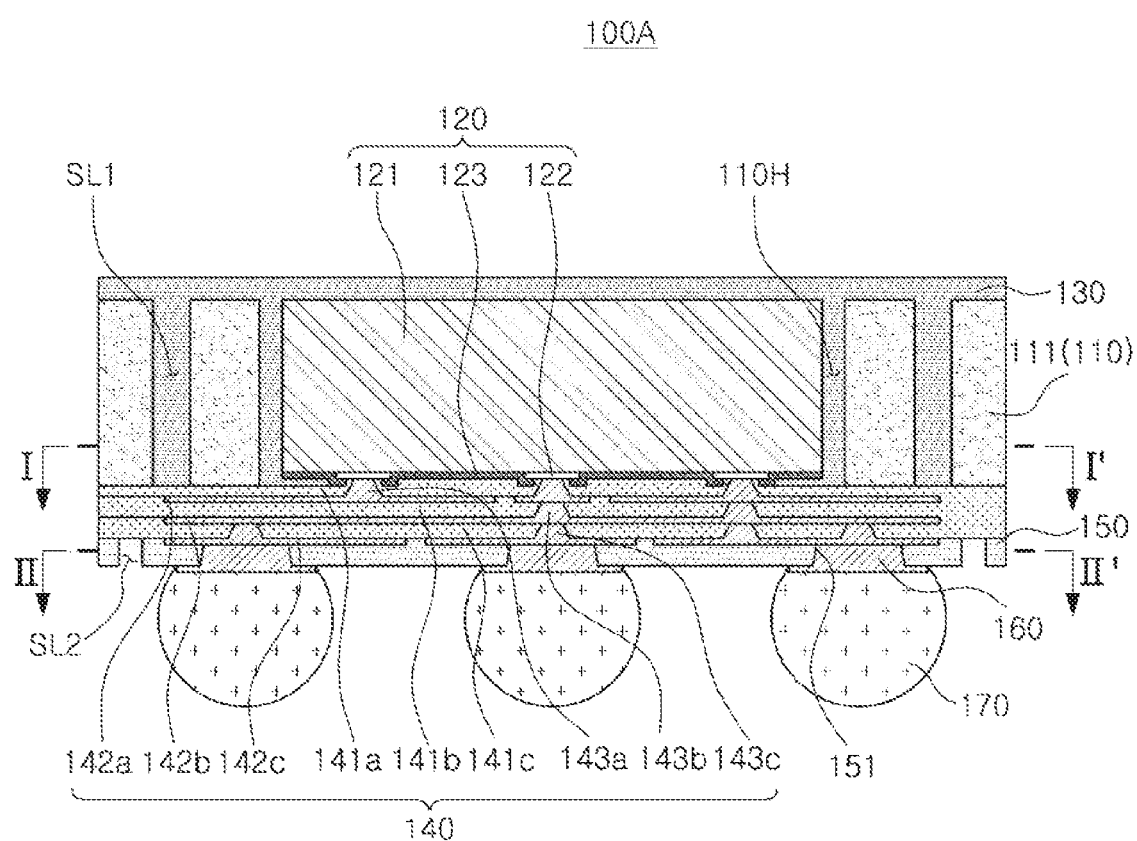
FIG. 9 is a schematic cross-sectional view illustrating an example of a fan-out semiconductor package.

FIG. 9 is a schematic cross-sectional view illustrating an example of a fan-out semiconductor package.

Figure 10A:
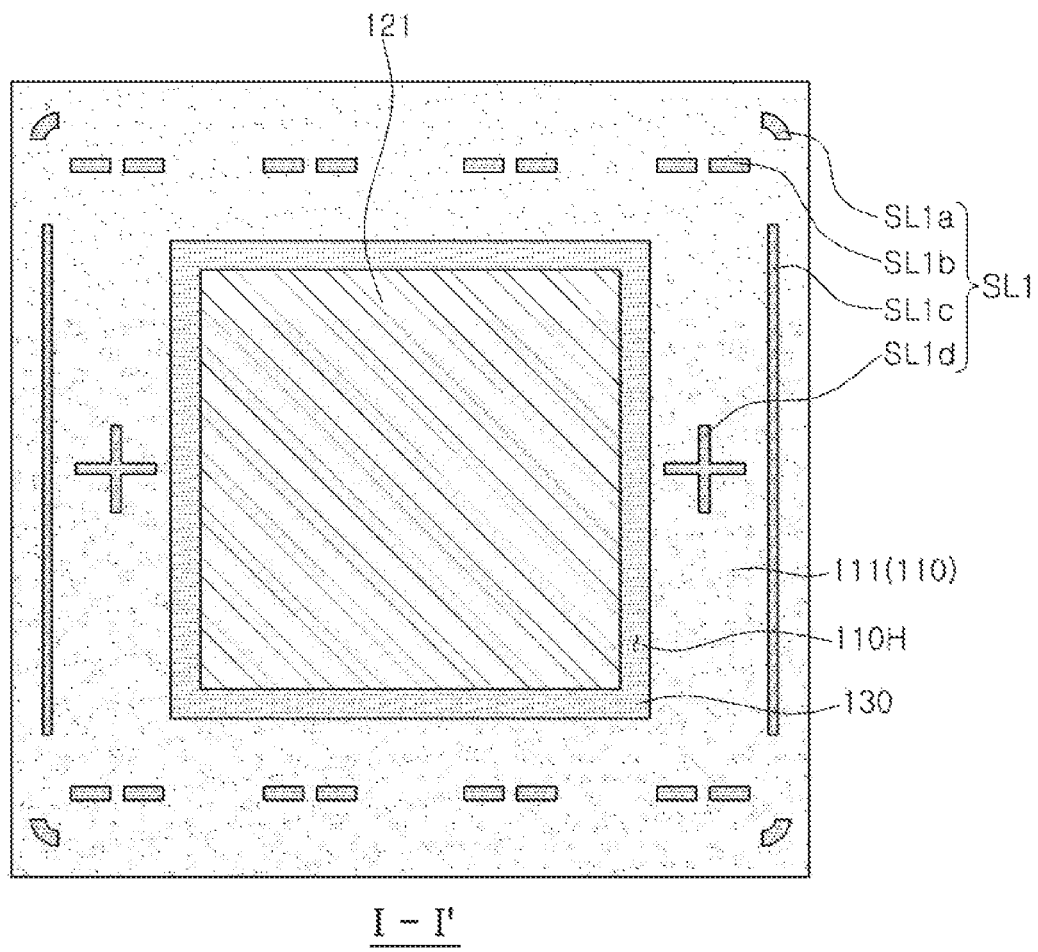
FIGS. 10A and 10B are schematic plan views taken along lines I-I' and II-II' of the fan-out semiconductor package of FIG. 9.
Figure 10B:
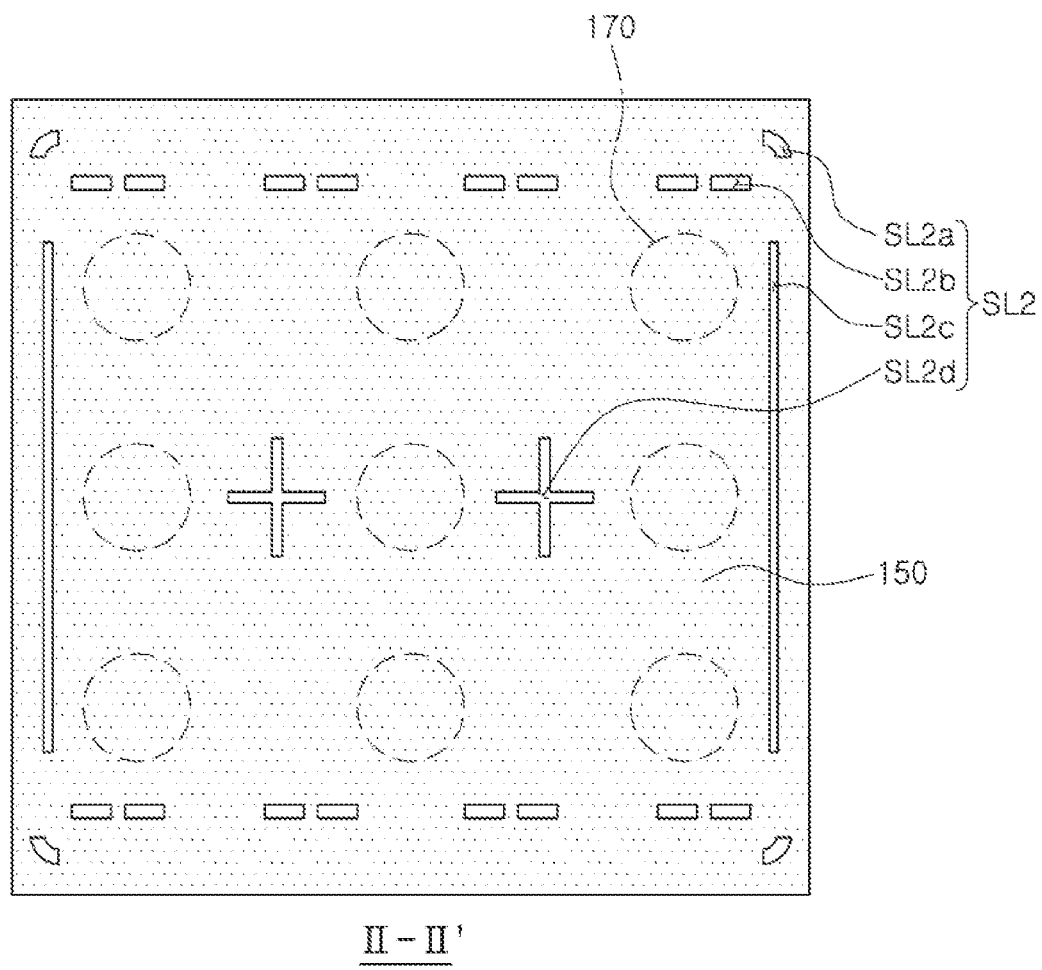

FIGS. 10A and 10B are schematic plan views taken along lines I-I' and II-II' of the fan-out semiconductor package of FIG. 9.

Referring to FIGS. 9, 10A, and 10B, a fan-out semiconductor package 100A according to an exemplary embodiment may include a core member 110 having a through-hole 110H, a semiconductor chip 120 disposed in the through-hole 110H of the core member 110 and having an active surface having connection pads 122 disposed thereon and an inactive surface opposing the active surface, an encapsulant 130 encapsulating at least portions of the core member 110 and the semiconductor chip 120, a connection member 140 disposed on the core member 110 and the active surface of the semiconductor chip 120, a passivation layer 150 disposed on the connection member 140, an underbump metal layer 160 disposed in openings 151 of the passivation layer 150, and electrical connection structures 170 disposed on the passivation layer 150 and connected to the underbump metal layer 160.

The fan-out semiconductor package 100A may have a first slot SL1 disposed in the core member 110 at the outside of the through-hole 110H and a second slot SL2 formed in the passivation layer 150. The first and second slots SL1 and SL2 may be filled with a material different from that of the core member 110 or the passivation layer 150 around the first and second slots SL1 and SL2. In the fan-out semiconductor package 100A, coefficients of thermal expansion of the core member 110, the semiconductor chip 120, the encapsulant 130, and the connection member 140 can be different from each other, such that the coefficients of thermal expansion of an upper portion and a lower portion of the core member 110 may be asymmetric with each other, and a defect such as warpage may thus occur. However, an occurrence of stress due to a difference in the coefficients of thermal expansion may be alleviated by forming the first slot SL1 in the core member 110 and the second slot SL2 in the passivation layer 150, thereby reducing an occurrence of warpage.

The first slot SL1 may be disposed in the core member 110 and filled with a material different from that of the core member 110. The first slot SL1 may be filled with the encapsulant 130 as illustrated, but is not limited thereto. The first slot SL1 may penetrate through at least a portion of the core member 110, and may penetrate through the entire thickness of the core member 110 as illustrated. In this case, a lower surface of the first slot SL1 may be in contact with the connection member 140. The first slot SL1 may have various shapes such as one or more rectangular shape(s), curved quadrangular shape(s), cross shape(s), line shape(s), and the like on a plane as illustrated in FIG. 10A. A shape and a layout of the first slot SL1 are not limited to those illustrated in the drawings, and may be variously changed according to exemplary embodiments. In particular, the first slot SL1 may be disposed in a region in which stress (e.g., caused by thermal expansion) is relatively heavily concentrated in the fan-out semiconductor package 100A.

The second slot SL2 may be formed in the passivation layer 150 and have a form which is externally (and downwardly) opened. That is, an inner portion of the second slot SL2 may be filled with air. The second slot SL2 may penetrate through at least a portion of the passivation layer 150, and may penetrate through the entire thickness of the passivation layer 150 as illustrated. In this case, a third (or other lowermost) insulating layer 141c of the connection member 140 may be exposed through an end portion of the second slot SL2. According to exemplary embodiments, the second slot SL2 may also be partially extended into the insulating layers 141a, 141b, and/or 141c of the connection member 140. The second slot SL2 may have various shapes such as one or more rectangular shape (s), curved quadrangular shape(s), cross shape(s), line shape(s), and the like on a plane as illustrated in FIG. 10B. A shape and a layout of the second slot SL2 are not limited to those illustrated in the drawings, and may be variously changed according to exemplary embodiments. In particular, the second slot SL2 may be disposed in a region in which stress is relatively heavily concentrated in the fan-out semiconductor package 100A.

The respective components included in the fan-out semiconductor package 100A according to the exemplary embodiment will be described hereinafter in more detail.

The core member 110 may further improve rigidity of the fan-out semiconductor package 100A depending on certain materials, and serve to secure uniformity of a thickness of an encapsulant 130. When through-wirings, or the like, are formed in the core member 110, the fan-out semiconductor package 100A may be utilized as a package-on-package (POP) type package. The core member 110 may have the through-hole 110H. The semiconductor chip 120 may be disposed in the through-hole 110H to be spaced apart from the core member 110 by a predetermined distance. Side surfaces of the semiconductor chip 120 may be surrounded by the core member 110. However, such a form is only an example and may be variously modified to have other forms, and the core member 110 may perform another function depending on such a form.

The core member 110 may include an insulating layer 111. An insulating material may be used as the material of the insulating layer 111. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass fiber, a glass cloth or a glass fabric), for example, prepreg, Ajinomoto Build-up Film (ABF), FR-4, Bismaleimide Triazine (BT), or the like. Such a core member 110 may serve as a support member.

The first slot SL1 may be disposed in the core member 110. As illustrated in FIG. 10A, the first slot SL1 may be disposed around a body 121 of the semiconductor chip 120. The first slot SL1 may include slots SL1a disposed at corners of the fan-out semiconductor package 100A, rectangular slots SL1b disposed in one column at both sides of the semiconductor chip 120, slots SL1c disposed in an elongated line shape at both sides of the semiconductor chip 120 different from both sides of the semiconductor chip 120 at which the rectangular slots SL1b are disposed, and cross-shaped slots SL1d disposed between the semiconductor chip 120 and the slots SL1c. However, such a layout of the first slot SL1 is an example and may be disposed in consideration of materials, tendency of warpage, and the like of the components in the fan-out semiconductor package 100A. For example, the first slot SL1 may be disposed at high density in a region in which a volume of the core member 110 is relatively large. The first slot SL1 may be disposed to penetrate through the entirety (e.g., entire thickness) of the core member 110 or may be disposed to penetrate through at least a portion of the core member 110 (e.g., at least a portion of a thickness of the core member). For example, according to exemplary embodiments, the first slot SL1 may be disposed to be recessed from an upper surface of the core member 110 by only a predetermined depth. In particular, in the case in which the first slot SL1 penetrates through the entirety of the core member 110, the first slot SL1 may be formed in the same process as a process of forming the through-hole 110H. As a result, the first slot SL1 may have the same depth as that of the through-hole 110H.

The semiconductor chip 120 may be an integrated circuit (IC) providing several hundreds to several millions of elements or more integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. That is, the IC may be a logic chip such as an analog-to-digital converter, an application-specific IC (ASIC), or the like, or a memory chip such as a volatile memory (for example, a DRAM), a non-volatile memory (for example, a ROM), a flash memory, or the like. In addition, the above-mentioned elements may also be combined with each other and be disposed in the semiconductor chip 120.

The semiconductor chip 120 may be formed on the basis of an active wafer. In this case, a base material of a body 121 may be silicon (Si), germanium (Ge), gallium arsenide (GaAs), or the like. Various circuits may be formed on or in the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pad 122 may have a step with respect to a lower surface of the encapsulant 130 through the passivation layer 123. Resultantly, a phenomenon in which the encapsulant 130 bleeds into the lower surface of the connection pads 122 may be prevented to some extent. An insulating layer (not illustrated), and the like, may also be further disposed in other appropriate positions. The semiconductor chip 120 may be a bare die, a redistribution layer (not illustrated) may further be formed on the active surface of the semiconductor chip 120, if desired, and bumps (not illustrated), or the like, may be connected to the connection pads 122.

The encapsulant 130 may protect the core member 110, the semiconductor chip 120, and the like. An encapsulation form of the encapsulant 130 is not particularly limited, and may be a form in which the encapsulant 130 surrounds at least portions of the core member 110, the semiconductor chip 120, and the like. For example, the encapsulant 130 may cover the core member 110 and the inactive surface of the semiconductor chip 120, and fill spaces between walls of the through-hole 110H and the side surfaces of the semiconductor chip 120, and the first slot SL1. In addition, the encapsulant 130 may also fill at least a portion of a space between the passivation layer 123 of the semiconductor chip 120 and the connection member 140. The encapsulant 130 may fill the through-hole 110H to thus serve as an adhesive and reduce buckling of the semiconductor chip 120, depending on certain materials. In addition, the encapsulant 130 optionally fills the first slot SL1, such that stress in the fan-out semiconductor package 100A may be alleviated and adhesion with the core member 110 may be increased.

A material of the encapsulant 130 is not particularly limited. For example, an insulating material may be used as the material of the encapsulant 130. In this case, the insulating material may be a thermosetting resin such as an epoxy resin, a thermoplastic resin such as a polyimide resin, a resin in which the thermosetting resin or the thermoplastic resin is mixed with an inorganic filler, or impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Alternatively, a PID resin may also be used as the insulating material.

The connection member 140 may redistribute the connection pads 122 of the semiconductor chip 120. Several tens to several hundreds of connection pads 122 of the semiconductor chip 120 having various functions may be redistributed by the connection member 140, and may be physically or electrically externally connected through the electrical connection structures 170 depending on the functions. The connection member 140 may include a first insulating layer 141a disposed on the core member 110 and the active surface of the semiconductor chip 120, a first redistribution layer 142a disposed on the first insulating layer 141a, a first via 143a connecting the first redistribution layer 142a and the connection pads 122 of the semiconductor chip 120 to each other, a second insulating layer 141b disposed on the first insulating layer 141a, a second redistribution layer 142b disposed on the second insulating layer 141b, a second via 143b penetrating through the second insulating layer 141b and connecting the first and second redistribution layers 142a and 142b to each other, a third insulating layer 141c disposed on the second insulating layer 141b, a third redistribution layer 142c disposed on the third insulating layer 141c, and a third via 143c penetrating through the third insulating layer 141c and connecting the second and third redistribution layers 142b and 142c to each other. The first to third redistribution layers 142a, 142b, and 142c may be electrically connected to each other and to connection pads 122.

An insulating material may be used as a material of each of the insulating layers 141a, 141b, and 141c. In this case, a photosensitive insulating material such as a photo imageable dielectric (PID) resin may also be used as the insulating material. That is, the insulating layers 141a, 141b, and 141c may be photosensitive insulating layers. When the insulating layers 141a, 141b, and 141c have photosensitive properties, the insulating layers 141a, 141b, and 141c may be formed to have a smaller thickness, and fine pitches of the via layers 143a, 143b, and 143c may be achieved more easily. The insulating layers 141a, 141b, and 141c may be photosensitive insulating layers including an insulating resin and an inorganic filler. When the insulating layers 141a, 141b, and 141c are multiple layers, the materials of the insulating layers 141a, 141b, and 141c may be the same as each other, and may alternatively be different from each other, if appropriate. When the insulating layers 141a, 141b, and 141c are multiple layers, the insulating layers 141a, 141b, and 141c may be integrated with each other depending on a process, such that a boundary therebetween may also not be apparent. In some cases, a larger number of insulating layers than those illustrated in the drawing may be formed.

The redistribution layers 142a, 142b, and 142c may serve to substantially redistribute the connection pads 122. A material of each of the redistribution layers 142a, 142b, and 142c may be a conductive material such as copper (Cu), aluminum (Al), silver (Ag), tin (Sn), gold (Au), nickel (Ni), lead (Pb), titanium (Ti), or alloys thereof. The redistribution layers 142a, 142b, and 142c may perform various functions depending on designs of their corresponding layers. For example, the wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142a, 142b, and 142c may include via pad patterns, electrical connection structure pad patterns, and the like.

The vias 143a, 143b, and 143c may electrically connect the redistribution layers 142a, 142b, and 142c, and the connection pads 122, or the like, formed on different layers to each other, resulting in an electrical path in the fan-out semiconductor package 100A. A material of each of the vias 143a, 143b, and 143c may be a conductive material such as copper (Cu), aluminum (Al), silver (Ag), tin (Sn), gold (Au), nickel (Ni), lead (Pb), titanium (Ti), or alloys thereof. Each of the vias 143a, 143b, and 143c may be completely filled with the conductive material, or the conductive material may also be formed along a wall of each of the vias. In addition, each of the vias 143a, 143b, and 143c may have any of a variety of shapes such as a tapered shape, a cylindrical shape, and the like.

The passivation layer 150 may protect the connection member 140 from external physical or chemical impacts. The passivation layer 150 may have openings 151 exposing at least portions of the third (or lowermost) redistribution layer 142c of the connection member 140. The number of openings 151 formed in the passivation layer 150 may be several tens to several thousands. The passivation layer 150 may have a second slot SL2 exposing at least portions of the third insulating layer 141c of the connection member 140. A material of the passivation layer 150 is not particularly limited. For example, an insulating material may be used as the material of the passivation layer 150. In this case, the insulating material may be a thermosetting resin such as an epoxy resin, a thermoplastic resin such as a polyimide resin, a resin in which the thermosetting resin or the thermoplastic resin is mixed with an inorganic filler, or impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Alternatively, a solder resist may also be used.

The second slot SL2 may have a form which is externally opened. The second slot SL2 may be disposed around the electrical connection structures 170 and between the electrical connection structures 170 as illustrated in FIG. 10B. The second slot SL2 may be spaced apart from the electrical connection structures 170 so as not to contact the electrical connection structures 170. The second slot SL2 may include curved rectangular slots SL2a disposed at corners of the fan-out semiconductor package 100A, rectangular slots SL2b disposed in one column at both sides of the passivation layer 150, slots SL2c disposed in an elongated line shape at both sides of the passivation layer 150 different from sides of the passivation layer 150 at which the rectangular slots SL2b are disposed, and cross-shaped slots SL2d disposed between the electrical connection structures 170. However, such a layout of the second slot SL2 is an example and may be disposed in consideration of materials, tendency of warpage, and the like of the components in the fan-out semiconductor package 100A. For example, the second slot SL2 may be disposed at high density in a region in which a volume of the passivation layer 150 is relatively large. In addition, the second slot(s) SL2 need not be disposed in the same form as the first slot SL1, and may be disposed at (or centered at) the same position in a vertical direction or may be disposed to be shifted by a predetermined interval relative to the first slot(s) SL1. The second slot SL2 may be disposed to penetrate through the entirety of the passivation layer 150 or may be disposed to penetrate through at least a portion of the thickness of the passivation layer 150. For example, according to exemplary embodiments, the second slot SL2 may be disposed to be recessed from a lower surface of the passivation layer 150 by only a predetermined depth. Alternatively, the second slot SL2 may have a relative deep depth and may also be extended to at least portions of the insulating layers 141a, 141b, and 141c of the connection member 140 including the third (or lowermost) insulating layer 141c.

The underbump metal layer 160 may improve connection reliability of the electrical connection structures 170 to improve board level reliability of the fan-out semiconductor package 100A. The underbump metal layer 160 may be connected to the third redistribution layer 142c of the connection member 140 exposed through the openings 151 of the first passivation layer 150. The underbump metal layer 160 may be formed in the openings 151 of the passivation layer 150 by a metallization method using a conductive metal such as a metal, but is not limited thereto.

The electrical connection structures 170 may physically or electrically externally connect the fan-out semiconductor package 100A. For example, the fan-out semiconductor package 100A may be mounted on the mainboard of the electronic device through the electrical connection structures 170. Each of the electrical connection structures 170 may be formed of a conductive material, for example, a solder, or the like. However, this is only an example, and a material of each of the electrical connection structures 170 is not limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, and may be sufficiently modified depending on design particulars. For example, the electrical connection structures 170 may be provided in an amount of several tens to several thousand according to the number of connection pads 122, or may be provided in an amount of several tens to several thousand or more or several tens to several thousand or less. When the electrical connection structures 170 are solder balls, the electrical connection structures 170 may cover side surfaces of the underbump metal layer 160 extending onto one surface of the passivation layer 150, and connection reliability may be more excellent.

At least one of the electrical connection structures 170 may be disposed in a fan-out region. The fan-out region is a region outside of a footprint region in which the semiconductor chip 120 is disposed. The fan-out package may have greater reliability than that of a fan-in package, may implement a plurality of I/O terminals, and may easily perform 3D interconnection. In addition, as compared to a ball grid array (BGA) package, a land grid array (LGA) package, or the like, the fan-out package may be manufactured to have a small thickness, and may have price competitiveness.

Meanwhile, although not illustrated in the drawings, a metal thin film may be formed on the walls of the through-hole 110H in order to dissipate heat or block electromagnetic waves. In addition, a plurality of semiconductor chips 120 performing functions that are the same as or different from each other may be disposed in the through-hole 110H or in another through-hole formed in the core member 110. In addition, a separate passive component such as an inductor, a capacitor, or the like, may be disposed in the through-hole 110H or in another through-hole formed in the core member 110. In addition, a passive component, for example, a surface mounted technology (SMT) component including an inductor, a capacitor, or the like, may be disposed on a surface of the passivation layer 150.

Figure 11:
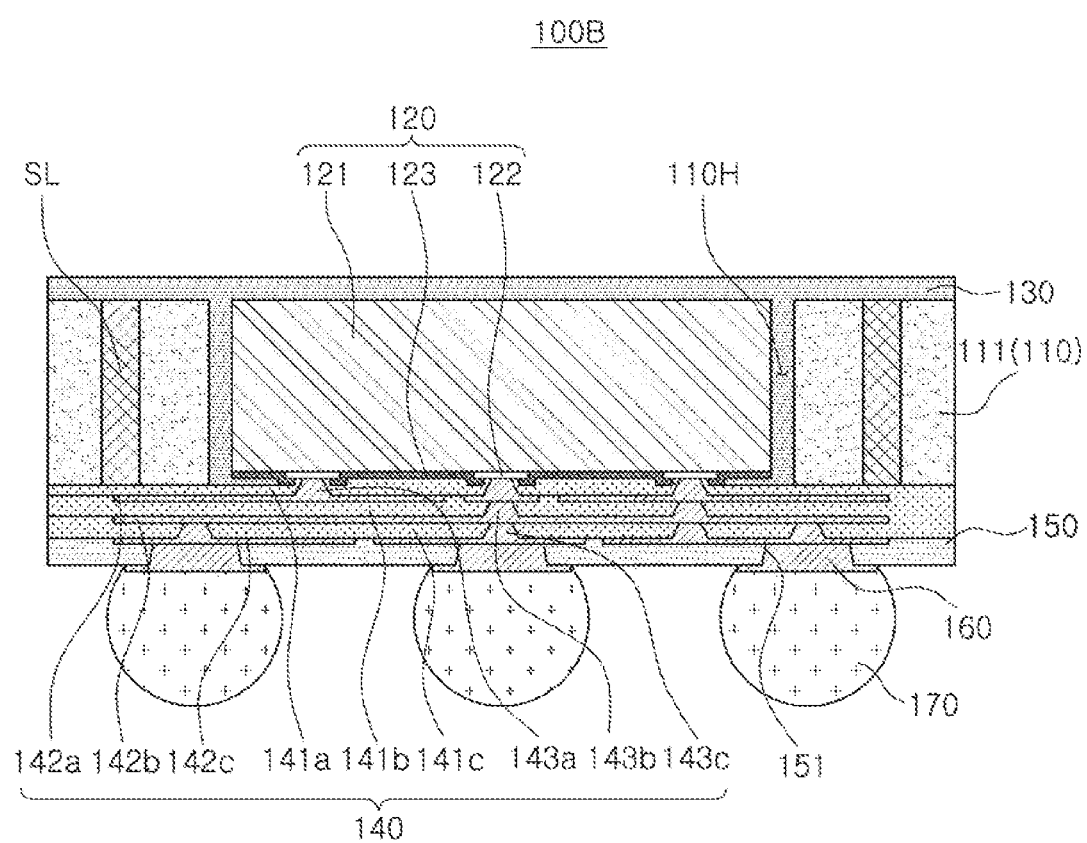
FIGS. 11 and 12 are schematic cross-sectional views illustrating other examples of fan-out semiconductor packages.
Figure 12:
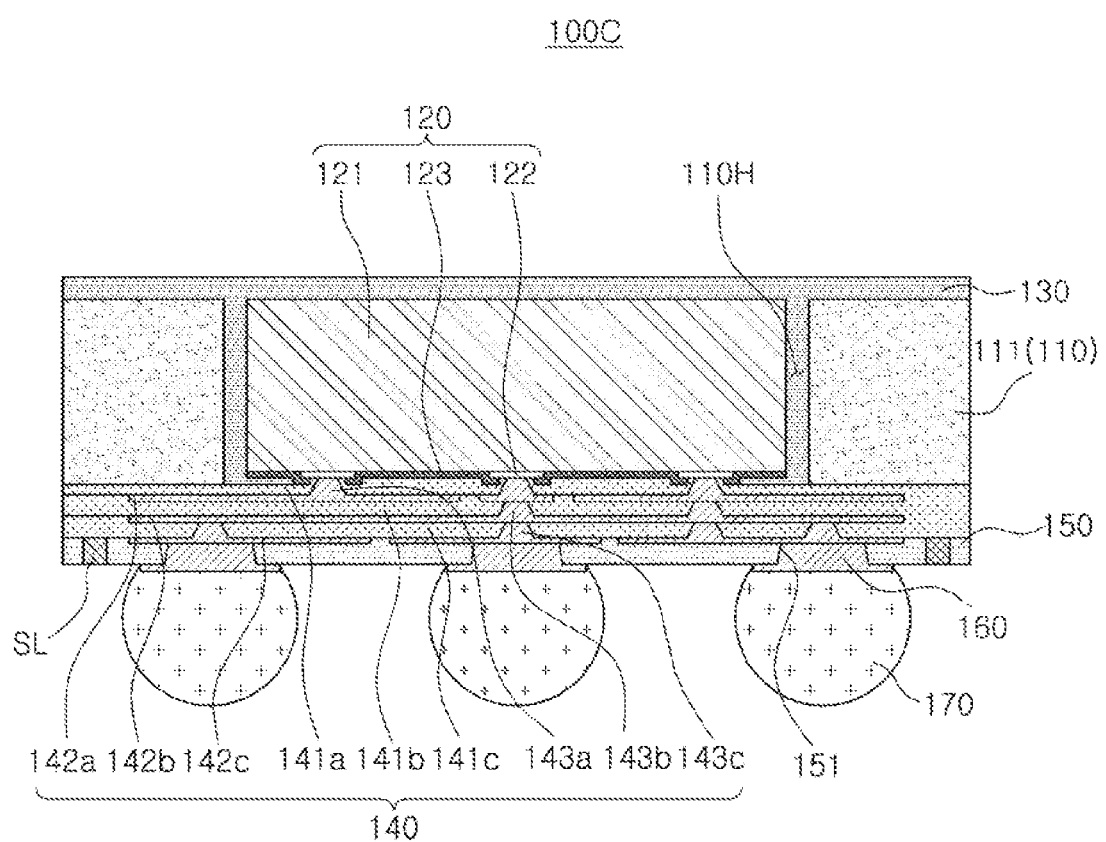

FIGS. 11 and 12 are schematic cross-sectional views illustrating another example of a fan-out semiconductor package.

Referring to FIG. 11, a fan-out semiconductor package 100B according to another exemplary embodiment may include only a slot SL disposed in the core member 110 at the outside of the through-hole 110H (and no slot disposed in the passivation layer 150). The slot SL may be filled with a material different from that of the core member 110. For example, the slot SL may be filled with the encapsulant 130, or may be filled with a material different from that of the encapsulant 130, for example, a metal material. Referring to FIG. 12, a fan-out semiconductor package 100C according to another exemplary embodiment may include only a slot SL formed in the passivation layer 150 (and no slot disposed in the core member 110). The slot SL may be filled with a material different from that of the passivation layer 150. For example, the slot SL may be filled with air, or may be filled with an insulating material different from that of the passivation layer 150.

The first and second slots SL1 and SL2 of FIG. 9 are not necessarily disposed together as in the fan-out semiconductor packages 100B and 100C described with reference to FIGS. 11 and 12, and at least one of the first or second slot SL1 and SL2 may be disposed. In addition, a material filling the first and second slots SL1 and SL2 may also be variously changed according to the exemplary embodiments such that different materials may fill the first and second slots SL1 and SL2.

Figure 13:
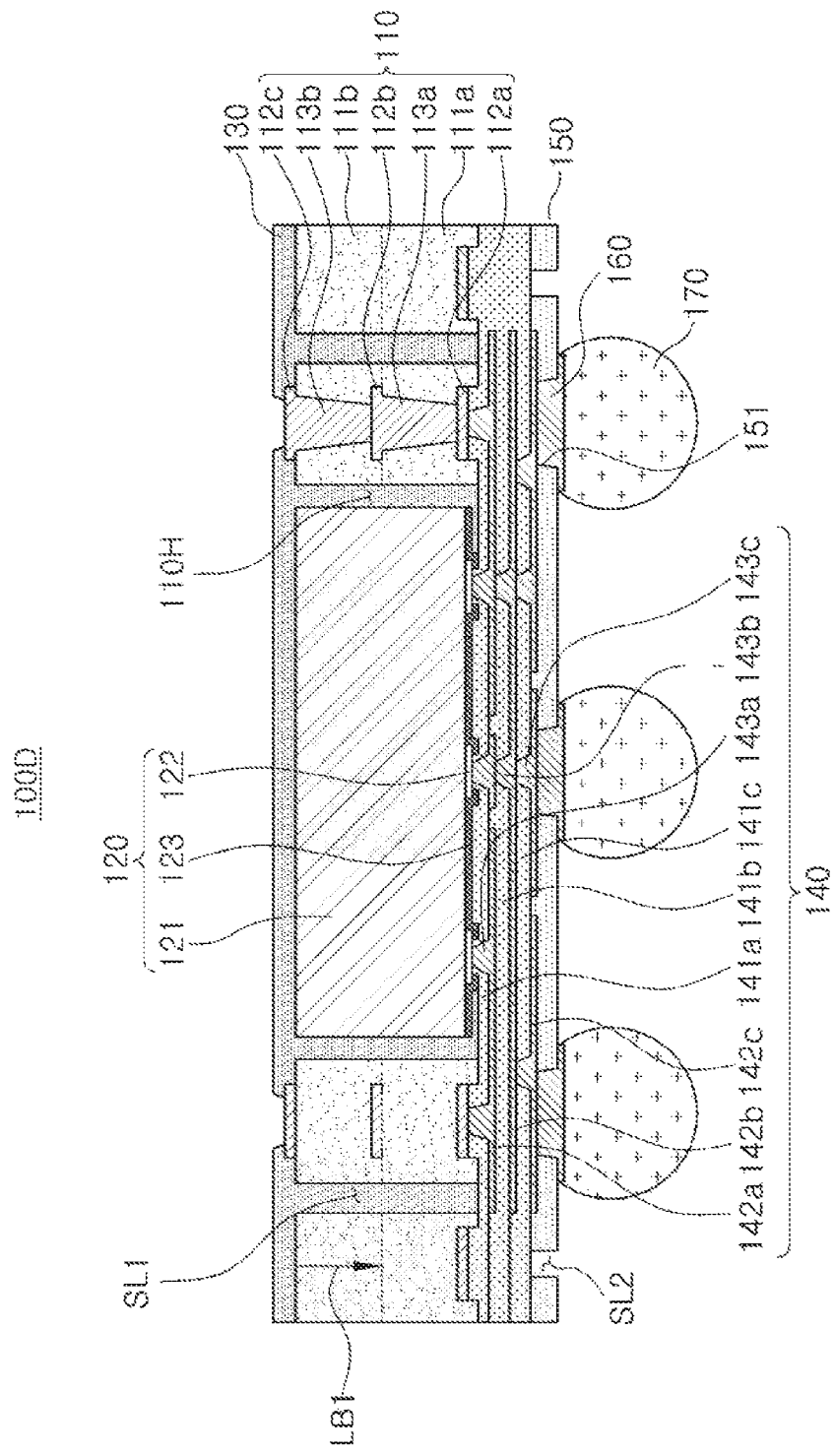
FIG. 13 is a schematic cross-sectional view illustrating another example of a fan-out semiconductor package.

FIG. 13 is a schematic cross-sectional view illustrating another example of a fan-out semiconductor package.

Referring to FIG. 13, in a fan-out semiconductor package 100D according to another exemplary embodiment, a core member 110 may include a first insulating layer 111a in contact with a connection member 140, a first wiring layer 112a in contact with the connection member 140 and embedded in the first insulating layer 111a, a second wiring layer 112b disposed on the other surface of the first insulating layer 111a opposing one surface of the first insulating layer 111a in which the first wiring layer 112a is embedded, a second insulating layer 111b disposed on the first insulating layer 111a and covering the second wiring layer 112b, and a third wiring layer 112c disposed on the second insulating layer 111b. The first to third wiring layers 112a, 112b, and 112c may be electrically connected to connection pads 122 and/or the underbump metal layer 160. The first and second wiring layers 112a and 112b and the second and third wiring layers 112b and 112c may be electrically connected to each other through first and second vias 113a and 113b penetrating through the first and second insulating layers 111a and 111b, respectively.

When the first wiring layer 112a is embedded in the first insulating layer 111a, a step generated due to a thickness of the first wiring layer 112a may be significantly reduced, and an insulating distance of the connection member 140 may thus become constant. That is, a difference between a distance from a first redistribution layer 142a of the connection member 140 to a lower surface of the first insulating layer 111a and a distance from the first redistribution layer 142a of the connection member 140 to the connection pad 122 of a semiconductor chip 120 may be smaller than a thickness of the first wiring layer 112a. Therefore, a high density wiring design of the connection member 140 may be easy.

The lower surface of the first wiring layer 112a of the core member 110 may be disposed on a level above a lower surface of the connection pad 122 of a semiconductor chip 120. In addition, a distance between a redistribution layer 142a of the connection member 140 and the first redistribution layer 112a of the core member 110 may be greater than that between the first redistribution layer 142a of the connection member 140 and the connection pad 122 of the semiconductor chip 120. The reason is that the first wiring layer 112a may be recessed into the first insulating layer 111a. As described above, when the first wiring layer 112a is recessed into the first insulating layer 111a, such that the lower surface of the first insulating layer 111a and the lower surface of the first wiring layer 112a have a step therebetween, a phenomenon in which a material of the encapsulant 130 bleeds to pollute the first wiring layer 112a may be prevented. The second redistribution layer 112b of the core member 110 may be disposed between an active surface and an inactive surface of the semiconductor chip 120. The core member 110 may be formed at a thickness corresponding to that of the semiconductor chip 120. Therefore, the second wiring layer 112b formed in the core member 110 may be disposed on a level between the active surface and the inactive surface of the semiconductor chip 120.

Thicknesses of the wiring layers 112a, 112b, and 112c of the core member 110 may be greater than those of the redistribution layers 142a, 142b, and 142c of the connection member 140. Since the core member 110 may have a thickness equal to or greater than that of the semiconductor chip 120, the wiring layers 112a, 112b, and 112c may be formed at large sizes depending on a scale of the core member 110. On the other hand, the redistribution layers 142a, 142b, and 142c of the connection member 140 may be formed at sizes relatively smaller than those of the wiring layers 112a, 112b, and 112c for thinness.

A material of each of the insulating layers 111a and 111b is not particularly limited. For example, an insulating material may be used as the material of the insulating layers 111a and 111b. In this case, the insulating material may be a thermosetting resin such as an epoxy resin, a thermoplastic resin such as a polyimide resin, a resin in which the thermosetting resin or the thermoplastic resin is mixed with an inorganic filler, or impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Alternatively, a PID resin may also be used as the insulating material.

The wiring layers 112a, 112b, and 112c may serve to redistribute the connection pads 122 of the semiconductor chip 120. A material of each of the wiring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of their corresponding layers. For example, the wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a, 112b, and 112c may include via pads, wire pads, connection terminal pads, and the like.

The vias 113a and 113b may electrically connect the wiring layers 112a, 112b, and 112c formed on different layers to each other, resulting in an electrical path in the core member 110. A material of each of the vias 113a and 113b may be a conductive material. Each of the vias 113a and 113b may be completely filled with a conductive material, or a conductive material may also be formed along a wall of each of the via holes. In addition, each of the vias 113a and 113b may have any of a variety of shapes such as a tapered shape, a cylindrical shape, and the like. When holes for the first vias 113a are formed, some of the pads of the first wiring layer 112a may serve as a stopper, and it may thus be advantageous in a process that each of the first vias 113a has the tapered shape having a width of an upper surface that is greater than that of a lower surface. In this case, the first vias 113a may be integrated with pad patterns of the second wiring layer 112b. In addition, when holes for the second vias 113b are formed, some of the pads of the second wiring layer 112b may serve as a stopper, and it may thus be advantageous in a process that each of the second vias 113b has the tapered shape having a width of an upper surface that is greater than that of a lower surface. In this case, the second vias 113b may be integrated with pad patterns of the third wiring layer 112c.

The fan-out semiconductor package 100D may have a first slot SL1 penetrating through at least portions of the first and second insulating layers 111a and 111b of the core member 110 at the outside or spaced apart from a periphery of the through-hole 110H, and a second slot SL2 formed in the passivation layer 150. Each of the first and second slots SL1 and SL2 may be filled with a material different from a material of each of the first and second insulating layers 111a and 111b and the passivation layer 150 around the first and second slots SL1 and SL2. The first slot SL1 may be particularly formed in a region in which the wiring layers 112a, 112b, and 112c are not disposed, but are not limited thereto. According to exemplary embodiments, a depth of the first slot SL1 may be variously changed. For example, the first slot SL1 may be disposed to penetrate through only the second insulating layer 111b so as to be extended from an upper surface of the second insulating layer 111b to a first level LB1.

A full description about other components of the fan-out semiconductor package 100D is not provided here, and reference can instead be made to the description of the first and second slots SL1 and SL2 described with reference to FIGS. 9, 10A, and 10B above for more detailed information about the fan-out semiconductor package 100D and its component parts.

Figure 14:
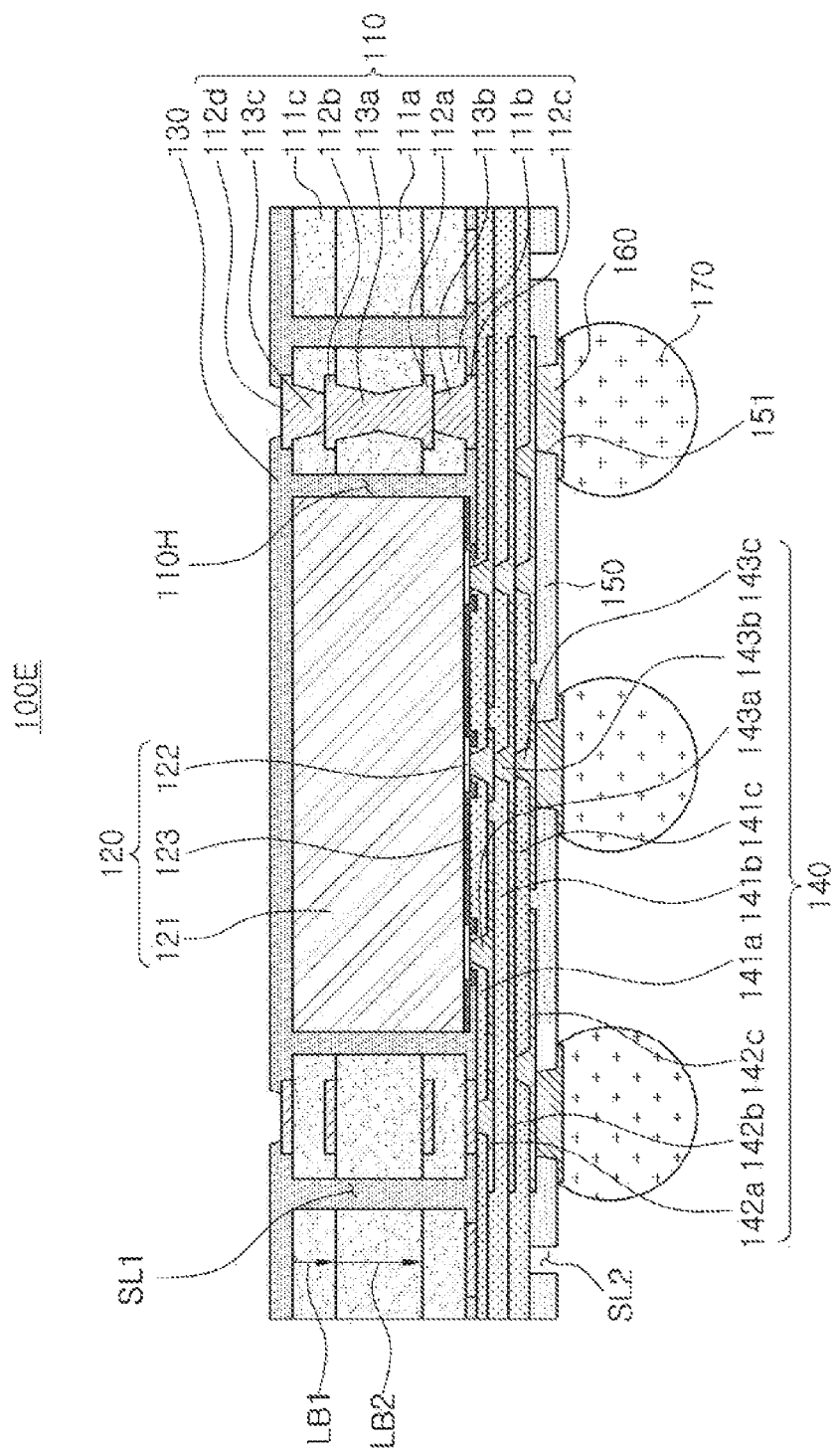
FIG. 14 is a schematic cross-sectional view illustrating another example of a fan-out semiconductor package.

FIG. 14 is a schematic cross-sectional view illustrating another example of a fan-out semiconductor package.

Referring to FIG. 14, in a fan-out semiconductor package 100E according to another exemplary embodiment, a core member 110 may include a first insulating layer 111a, a first wiring layer 112a and a second wiring layer 112b disposed on opposite surfaces of the first insulating layer 111a, respectively, a second insulating layer 111b disposed on the first insulating layer 111a and covering the first wiring layer 112a, a third wiring layer 112c disposed on the second insulating layer 111b, a third insulating layer 111c disposed on the first insulating layer 111a and covering the second wiring layer 112b, and a fourth wiring layer 112d disposed on the third insulating layer 111c. The first to fourth wiring layers 112a, 112b, 112c, and 112d may be electrically connected to connection pads 122. Since the core member 110 may include a large number of wiring layers 112a, 112b, 112c, and 112d, a connection member 140 may be further simplified. Therefore, a decrease in a yield depending on a defect occurring in a process of forming the connection member 140 may be suppressed. Meanwhile, the first to fourth wiring layers 112a, 112b, 112c, and 112d may be electrically connected to each other through first to third vias 113a, 113b, and 113c each penetrating through the first to third insulating layers 111a, 111b, and 111c.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring layers 112c and 112d. Similarly, the first vias 113a penetrating through the first insulating layer 111a may have a diameter greater than those of second vias 113b and third vias 113c each penetrating through the second insulating layer 111b and the third insulating layer 111c. The first insulating layer 111a may include an insulating material different from those of the second insulating layer 111b and the third insulating layer 111c. For example, the first insulating layer 111a may be, for example, prepreg including a core material, a filler, and an insulating resin, and the second insulating layer 111b and the third insulating layer 111c may be an ABF or a PID film including a filler and an insulating resin. However, the materials of the first insulating layer 111a and the second and third insulating layers 111b and 111c are not limited thereto.

A lower surface of the third wiring layer 112c of the core member 110 may be disposed on a level below a lower surface of the connection pad 122 of a semiconductor chip 120. In addition, a distance between a first redistribution layer 142a of the connection member 140 and the third wiring layer 112c of the core member 110 may be smaller than that between the first redistribution layer 142a of the connection member 140 and the connection pad 122 of the semiconductor chip 120. The reason is that the third wiring layer 112c may be disposed on the second insulating layer 111b in protruding form, resulting in being in contact with the connection member 140. The first wiring layer 112a and the second wiring layer 112b of the core member 110 may be disposed between an active surface and an inactive surface of the semiconductor chip 120. The core member 110 may be formed at a thickness corresponding to that of the semiconductor chip 120. Therefore, the first wiring layer 112a and the second wiring layer 112b formed in the core member 110 may be disposed on a level between the active surface and the inactive surface of the semiconductor chip 120.

Thicknesses of the wiring layers 112a, 112b, 112c, and 112d of the core member 110 may be greater than those of the redistribution layers 142a, 142b, and 142c of the connection member 140. Since the core member 110 may have a thickness equal to or greater than that of the semiconductor chip 120, the wiring layers 112a, 112b, 112c, and 112d may also be formed at larger sizes. On the other hand, the redistribution layers 142a, 142b, and 142c of the connection member 140 may be formed at relatively small sizes for thinness.

The fan-out semiconductor package 100E may have a first slot SL1 penetrating through at least portions of the first to third insulating layers 111a, 111b, and 111c of the core member 110 at the outside or spaced apart from a periphery of the through-hole 110H, and a second slot SL2 formed in the passivation layer 150. Each of the first and second slots SL1 and SL2 may be filled with a material different from a material of each of the first to third insulating layers 111a, 111b, and 111c or the passivation layer 150 around the first and second slots SL1 and SL2. In a case in which the first slot SL1 is filled with the encapsulant 130, a region between the first slot SL1 and the third wiring layer 112c below the first slot SL1 may also be filled with the encapsulant 130. The first slot SL1 may be particularly formed in a region in which the wiring layers 112a, 112b, 112c, and 112d are not disposed, but are not limited thereto. According to exemplary embodiments, a depth of the first slot SL1 may be variously changed. For example, the first slot SL1 may be disposed to penetrate through only the third insulating layer 111c so as to extend from an upper surface of the third insulating layer 111c to a first level LB1, or may penetrate through only the first and third insulating layers 111a and 111c so as to be extended from the upper surface of the third insulating layer 111c to a second level LB2.

A full description about other components of the fan-out semiconductor package 100E is not provided here, and reference can instead be made to the description of the first and second slots SL1 and SL2 described with reference to FIGS. 9, 10A, and 10B above for more detailed about the fan-out semiconductor package 100E and its component parts.

Herein, a lower side, a lower portion, a lower surface, and the like, are used to refer to a direction toward amounting surface of the fan-out semiconductor package in relation to cross sections shown in the drawings, while an upper side, an upper portion, an upper surface, and the like, are used to refer to a direction opposite to the lower direction. However, these directions are defined for convenience of explanation, and the claims are not particularly limited by the directions defined as described above.

The meaning of a "connection" of a component to another component in the description includes an indirect connection through an adhesive layer as well as a direct connection provided by direct contact between two components. In addition, "electrically connected" refers to concepts including a physical connection and a physical disconnection that nonetheless provides electrically connectivity. It can be understood that when an element is referred to with "first" and "second", the element is not limited thereby. The terms "first" and "second" may be used only for a purpose of distinguishing one element from another element, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

As set forth above, according to the exemplary embodiments, the fan-out semiconductor package of which the warpage is reduced may be provided by forming the slot filled with the different material in at least one of the core member or the passivation layer.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a core member having a through-hole;
a semiconductor chip disposed in the through-hole of the core member and having an active surface having connection pads disposed thereon and an inactive surface opposing the active surface;
an encapsulant encapsulating at least a portion of the semiconductor chip;
a connection member disposed on the active surface of the semiconductor chip and including a redistribution layer electrically connected to the connection pads of the semiconductor chip;
a passivation layer disposed on the connection member; and
electrical connection structures disposed on the passivation layer opposite to the connection member,
wherein the fan-out semiconductor package has a first slot spaced apart from the through-hole and penetrating through at least a portion of the core member, and a second slot entirely penetrating through at least a portion of the passivation layer in a thickness direction, and
wherein the second slot is disposed spaced apart from the electrical connection structures.

2. The fan-out semiconductor package of claim 1, wherein the first slot is entirely filled with the encapsulant.

3. The fan-out semiconductor package of claim 2, wherein the first slot is disposed outside a periphery of the through-hole.

4. The fan-out semiconductor package of claim 1, wherein the first slot is filled with a metal material.

5. The fan-out semiconductor package of claim 1, wherein the second slot is externally opened through a surface of the passivation layer facing away from the connection member.

6. The fan-out semiconductor package of claim 5, wherein the second slot is disposed between the electrical connection structures.

7. The fan-out semiconductor package of claim 5, wherein a portion of the connection member is externally exposed through the second slot.

8. The fan-out semiconductor package of claim 1, wherein the first slot and the second slot have a rectangular shape, a cross shape, or a line shape on a plane, respectively.

9. The fan-out semiconductor package of claim 1, wherein the core member includes a first insulating layer, a first wiring layer in contact with the connection member and embedded in the first insulating layer, and a second wiring layer disposed on a first surface of the first insulating layer opposing a second surface of the first insulating layer in which the first wiring layer is embedded, and
the first and second wiring layers are electrically connected to the connection pads of the semiconductor chip.

10. The fan-out semiconductor package of claim 9, wherein the core member further includes a second insulating layer disposed on the first insulating layer and covering the second wiring layer, and a third wiring layer disposed on the second insulating layer, and
the third wiring layer is electrically connected to the connection pads of the semiconductor chip.

11. The fan-out semiconductor package of claim 10, wherein the first slot penetrates through at least portions of the first and second insulating layers from an upper surface of the second insulating layer.

12. The fan-out semiconductor package of claim 1, wherein the core member includes a first insulating layer, and a first wiring layer and a second wiring layer disposed on opposite surfaces of the first insulating layer, and
the first and second wiring layers are electrically connected to the connection pads of the semiconductor chip.

13. The fan-out semiconductor package of claim 12, wherein the core member further includes second and third insulating layers disposed on the opposite surfaces of the first insulating layer and covering the first and second wiring layers, and third and fourth wiring layers disposed on the second and third insulating layers, and
the third and fourth wiring layers are electrically connected to the connection pads of the semiconductor chip.

14. The fan-out semiconductor package of claim 13, wherein the first slot penetrates through at least portions of the first, second, and third insulating layers from an upper surface of the third insulating layer.

15. A fan-out semiconductor package comprising:
a semiconductor chip having an active surface having connection pads disposed thereon and an inactive surface opposing the active surface;
an encapsulant encapsulating at least a portion of the semiconductor chip;
a connection member disposed on the active surface of the semiconductor chip and including a redistribution layer electrically connected to the connection pads of the semiconductor chip;
a passivation layer disposed on the connection member; and
electrical connection structures disposed on the passivation layer opposite to the connection member,
wherein the fan-out semiconductor package has a second slot entirely penetrating through at least a portion of the passivation layer in a thickness direction, and
wherein the second slot is disposed spaced apart from the electrical connection structures.

16. The fan-out semiconductor package of claim 15, further comprising:
a core member having a through-hole; and
a first slot of the core member,
wherein the first slot is filled with a material different from a material of the core member, and
the second slot is filled with a material different from a material of the passivation layer.

17. A fan-out semiconductor package comprising:
a connection member including a plurality of insulating layers, and a plurality of redistribution layers each including conductive traces disposed on insulating layers of the plurality of insulating layers;
a core member disposed on a first surface of the connection member;
a semiconductor chip disposed on the first surface of the connection member in a through-hole of the core member, the semiconductor chip having connection pads electrically connected to the redistribution layers of the connection member; and
a passivation layer disposed on a second surface of the connection member opposite to the first surface thereof,
wherein a first slot is disposed in the core member and a second slot is disposed in the passivation layer and the first slot is entirely filled with a material different from that of the core member, and
wherein a portion of the connection member is externally exposed through the second slot.

18. The fan-out semiconductor package of claim 17, further comprising an encapsulant disposed in the through-hole of the core member and encapsulating at least portions of the core member and the semiconductor chip,
wherein the first slot is entirely filled with the encapsulant.

19. The fan-out semiconductor package of claim 17, wherein the first slot comprises a plurality of slots each disposed in the core member to be spaced apart from the through-hole between the through-hole and an outer periphery of the core member, each extending through an entire thickness of the core member, and each entirely and homogeneously filled with the material different from that of the core member.

20. The fan-out semiconductor package of claim 19, wherein the core member comprises first and second insulating layers in contact with each other, and a wiring layer disposed between the first and second insulating layers and electrically connected to the connection pads of the semiconductor chip via the conductive traces of the connection member,
wherein the wiring layer is spaced apart from the through-hole and the slots of the plurality of slots.

* * * * *